(12) United States Patent
Kamio (10) Patent No.: US 11,317,551 B2
(45) Date of Patent: Apr. 26, 2022

(54) COMPONENT MOUNTER

(71) Applicant: FUJI CORPORATION, Chiryu (JP)

(72) Inventor: Ryohei Kamio, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 479 days.

(21) Appl. No.: 16/339,038

(22) PCT Filed: Oct. 5, 2016

(86) PCT No.: PCT/JP2016/079661
§ 371 (c)(1),
(2) Date: Apr. 3, 2019

(87) PCT Pub. No.: WO2018/066091
PCT Pub. Date: Apr. 12, 2018

(65) Prior Publication Data
US 2019/0246530 A1 Aug. 8, 2019

(51) Int. Cl.
*H05K 13/04* (2006.01)
*H05K 13/08* (2006.01)

(52) U.S. Cl.
CPC ..... *H05K 13/0413* (2013.01); *H05K 13/0409* (2018.08); *H05K 13/0419* (2018.08); *H05K 13/0465* (2013.01); *H05K 13/0469* (2013.01); *H05K 13/0812* (2018.08); *H05K 13/0815* (2018.08)

(58) Field of Classification Search
CPC ........... H05K 13/0465; H05K 13/0813; H05K 13/0469; H05K 13/0478; H05K 3/3485; H05K 13/0413; H05K 13/0812; H05K 13/0815
See application file for complete search history.

(56) References Cited

U.S. PATENT DOCUMENTS 5,894,657 A 4/1999 Kanayama et al.
7,819,300 B2 * 10/2010 Furuta .................... B23K 1/203
228/22
2016/0100089 A1 * 4/2016 Nozawa ................ G06T 7/0004
348/95

FOREIGN PATENT DOCUMENTS

CN 105188333 A 12/2015
JP 2010-182983 A 8/2010

OTHER PUBLICATIONS

International Search Report dated Jan. 10, 2017 in PCT/JP2016/079661 filed on Oct. 5, 2016.

* cited by examiner

*Primary Examiner* — Livius R. Cazan
(74) *Attorney, Agent, or Firm* — Oblon, McClelland, Maier & Neustadt, L.L.P.

(57) ABSTRACT

A component mounter provided with head, a device for moving head, transfer unit, and a mounting controller. Round plate is an example of a container for paste. The mounting controller, in the first operation mode, images components held by multiple nozzles using an imaging device before transfer is performed, and recognizes the position and/or orientation of each component based on the image of each component. Further, the head and the head moving device are controlled based on the position and/or orientation of each component such that a coating layer is transferred to connection terminals of each component at a transfer area of each of the components set in advance that does not include a margin based on the holding deviation of each component.

10 Claims, 8 Drawing Sheets

FIG. 12

COMPONENT MOUNTER

TECHNICAL FIELD

The present application relates to a component mounter.

BACKGROUND ART

Conventionally, there is a known component mounter, which has multiple nozzles attached to a head that is movable in an XY plane by an XY robot, and that sequentially picks up components supplied by a component supply device with the multiple nozzles, then moves the head above a board and mounts each of the components on the board. Here, solder paste is printed in advance onto the board at component mounting positions. In recent years, in accordance with the miniaturization of components, the amount of solder paste to be printed has become smaller, making printing according to design specifications difficult. Due to this, component mounters have been developed that, instead of printing paste onto a board at component mounting positions, transfer a layer of paste onto the connection terminals provided on the lower surface of a component (such as a BGA) (for example, refer to patent literature 1). Here, the coated layer is set such that the transfer areas of each component do not interfere with each other.

CITATION LIST

Patent Literature

Patent literature 1: JP-A-2010-182983

BRIEF SUMMARY

Technical Problem

However, components to be picked up by a nozzle are not picked up at the same position and in the same orientation every time, there are cases in which components are picked up with the component center deviated from the center of the nozzle, or with the component in a rotated state. Considering this position and orientation deviation, it is necessary to set transfer areas with a large margin of error. Because this makes the distance between transfer areas large, the movement distance of the head from transferring a coating onto a component at a given transfer area to transferring a coating layer onto a component at a subsequent transfer area is longer, the head movement time is longer, and the quantity of boards that can be processed in a given time period (throughput) decreases.

The present disclosure takes account of such problems and an object thereof is to appropriately set a transfer area of each component in a component mounter that transfers a coating layer to components.

Solution to Problem

A component mounter of the present disclosure includes:
a head provided with multiple component holding sections;
a head moving device configured to move the head;
a component supply device configured to supply components provided with a connection terminal on a lower side of the component to the component holding section;
an imaging device configured to image the component held by the component holding tool;
a transfer device configured to provide a coating layer of a paste that is to be transferred to the connection terminal of the component; and
a control device configured to control the head, the head moving device, the component supply device, the imaging device, and the transfer device based on a first operation mode,
wherein
in the first operation mode, the control device is configured to perform control to, after the components supplied by the component supply device have been sequentially picked up by the multiple component holding sections of the head, cause the imaging device to image the components held by the multiple component holding sections, recognize the position and/or orientation of each of the components based on the images of each component, and control the head and the head moving device based on the position and/or orientation of each of the components such that the coating layer is transferred to the connection terminals of each of the components in a transfer area of each of the components set in advance that does not include a margin based on a holding deviation of each of the components, and then each of the components is mounted on the board.

With this component mounter, in the first operation mode, components held by multiple component holding sections are imaged by an imaging device before transfer is performed, and the position and/or orientation of each component is recognized based on the image of each component. Then, the head and the head moving device are controlled based on the position and/or orientation of each component such that a coating layer is transferred to connection terminals of each component at a transfer area of each of the components set in advance that does not include a margin based on the holding deviation of each component. In this first operation mode, because a coating layer is transferred to connection terminals of each component at a transfer area of each of the components based on the pickup deviation of each component, even if the transfer area of each component is set as small as possible without including a margin based on the holding deviation of each component, it is possible to transfer the coating layer accurately within that transfer area. Thus, the moving distance of the head between transfer areas is made as small as possible.

In a component mounter of the present disclosure, the control device may be configured to, in the first operation mode, after the coating layer has been applied to each of the connection terminals of each of the components in each of the set component transfer areas, and before mounting each of the components on the board, cause the imaging device to image the component held by the multiple component holding sections, and determine whether the coating layer has been appropriately transferred to the connection terminals of each of the components based on the image of each component. Thus, each component is mounted on the board after determining whether the coating layer has been properly transferred. Therefore, for a component for which the coating layer has not been transferred properly, it is possible to cancel mounting onto the board.

In a component mounter of the present disclosure, the control device may be configured to control the head, the head moving device, the component supply device, the imaging device, and the transfer device based on a second operation mode in addition to the first operation mode, wherein, in the second operation mode, after the components supplied by the component supply device have been sequentially picked up by the multiple component holding sections, the coating layer is transferred to the connection terminals of each of the components in the transfer area of each of the components set in advance that includes a margin based on the holding deviation of each of the components, and then each of the components is mounted on the board. In other words, although in the first operation mode the position and orientation of each component is recognized before transfer and that recognition requires time, because the transfer area of each component can be set as small as possible, the movement time of the head between transfer areas is made shorter. On the other hand, in the second operation mode the position and orientation of each component is not recognized before transfer, and the transfer area of each component is set with some margin for error, therefore the head movement time between transfer areas is longer, but no time is required for recognizing the position and orientation of each component.

In a component mounter of the present disclosure configured to perform control based on a first operation mode and to perform control based on a second operation mode in this manner, the control device may be configured to compare component mounting time if performing control based on the first operation mode and component mounting time if performing control based on the second operation mode, and select the operation mode with a shorter component mounting time. Accordingly, control is performed using the operation mode with better throughput that is selected automatically. Alternatively, the control device may be configured to perform control based on an operation mode entered by an operator. Accordingly, control is performed based on the operation mode that the operator wants to use.

In a component mounter of the present disclosure, it is desirable for the component holding section to be a nozzle that holds the component using suction. The component holding section may be a type that holds a component by gripping such as a robot hand or the like, but when using a nozzle to pick up and hold a component using suction there is a tendency for a pickup deviation to occur, therefore the present disclosure is particularly applicable in this case.

DESCRIPTION OF EMBODIMENTS

Figure 1:
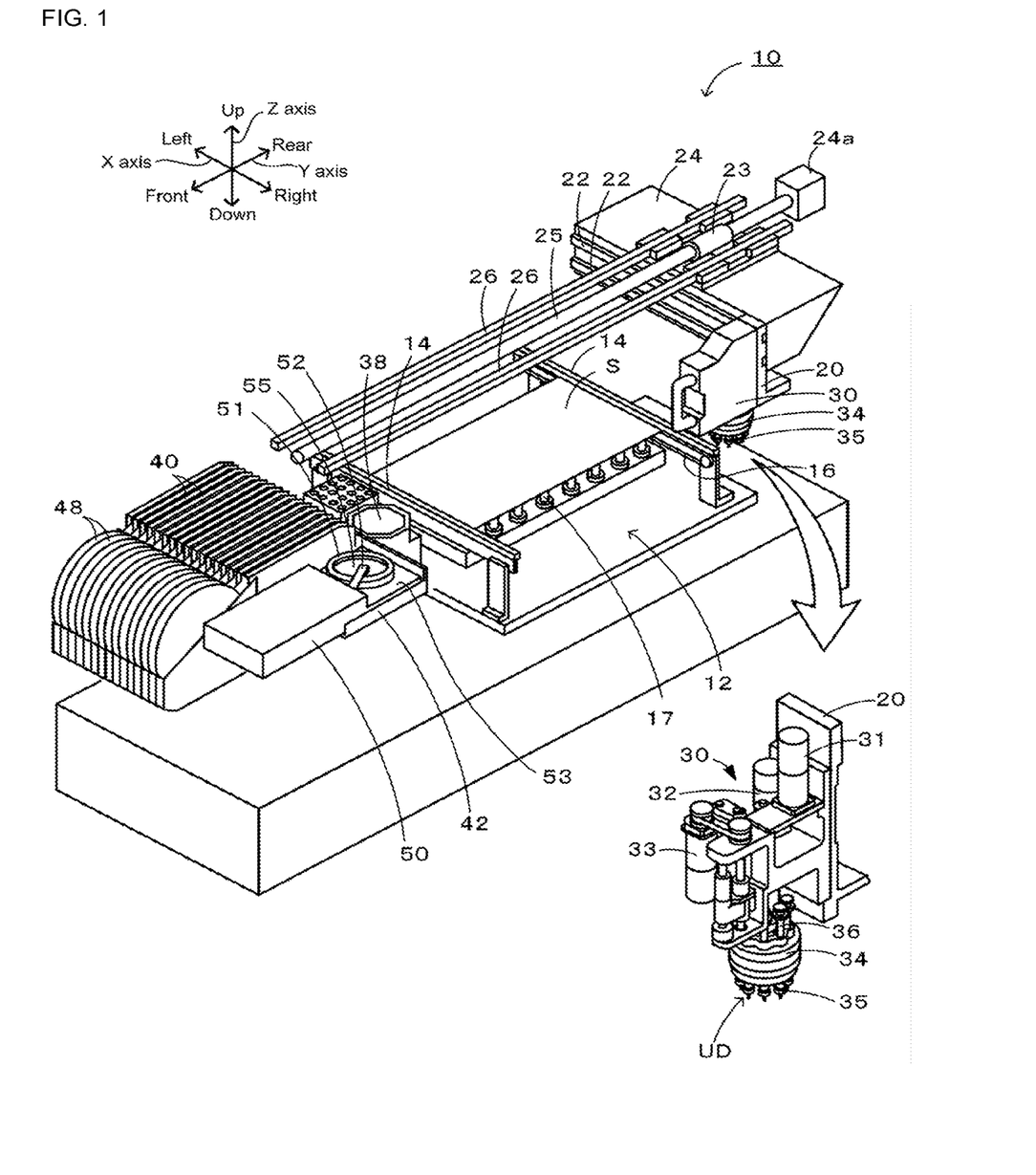
FIG. 1 is a perspective view of component mounter 10.
Figure 2:
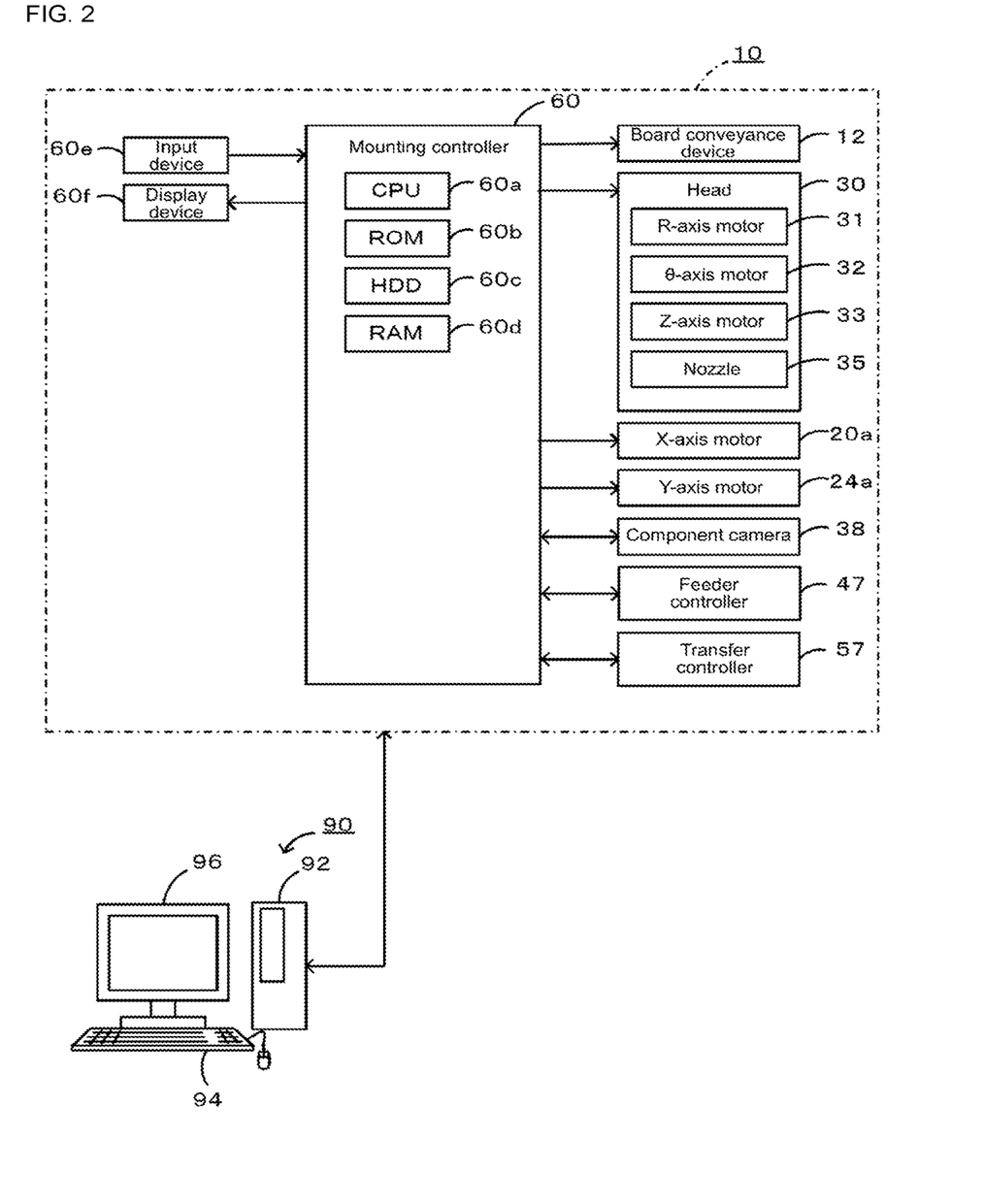
FIG. 2 shows electrical connections of component mounter 10.

Hereinafter, an embodiment of the present disclosure will be described with reference to the figures. FIG. 1 is a perspective view of component mounter 10; FIG. 2 shows electrical connections of component mounter 10. In the present embodiment, left-right directions (X axis), front-rear directions (Y axis), and up-down directions (Z axis) are set as shown in FIG. 1.

As shown in FIG. 1, component mounter 10 is provided with board conveyance device 12, head 30, nozzle 35, component camera 38, tape feeder 40, transfer unit 50, and mounting controller 60 (refer to FIG. 2) that performs various types of control.

Board conveyance device 12 conveys board S from left to right using conveyor belts 16 and 16 (only one of these is shown in FIG. 1) that are respectively attached to a pair of left and right conveyor rails 14 and 14. Also, board conveyance device 12 fixes board S by pushing board S from below via support pins 17 arranged below board S and contacting board S against guide sections of conveyor rails 14 and 14, and releases board S by lowering support pins 17.

Head 30 is removably attached to a front surface of X-axis slider 20. X-axis slider 20 is slidably attached to a pair of lower and upper guide rails 22 and 22 that are attached to a front surface of Y-axis slider 24 and that extend in the left-right direction. Y-axis slider 24 is integrated with nut 23 engaged on Y-axis ball screw 25 and is slidably attached to a pair of left and right guide rails 26 and 26 that extend in the front-rear direction. One end of Y-axis ball screw 25 is attached to Y-axis motor 24a and the other end is free. Y-axis slider 24 is slid along guide rails 26 and 26 by this ball screw mechanism. In other words, when Y-axis motor 24a rotates, Y-axis ball screw 25 rotates, causing nut 23 to slide along guide rails 26 and 26 together with Y-axis slider 24. Although not shown, X-axis slider 20 is slid along guide rails 22 and 22 by a ball screw mechanism provided with X-axis motor 20a (refer to FIG. 2) in a similar manner to Y-axis slider 24. Head 30 moves in a left-right direction in accordance with the left-right movement of X-axis slider 20 and moves in a front-rear direction in accordance with the front-rear movement of Y-axis slider 24.

Head 30 is provided with auto-tool 34 loaded with multiple (here, twelve) nozzle holders 36, to which nozzle 35 is attached, at equal intervals in a circumferential direction. Auto-tool 34 is removably attached to a holding section, not shown, of head 30. Head 30 is provided with R-axis motor 31, θ-axis motor 32, and Z-axis motor 33. R-axis motor 31 revolves nozzles 35 attached to each nozzle holder 36 in the circumferential direction of auto-tool 34 by rotating auto-tool 34 around its own center axis line (R axis). θ-axis motor 32 rotates (on its own axis) each nozzle holder 36 attached to auto-tool 34 on its own center axis line (θ axis). Z-axis motor 33 lowers nozzle holder 36 as a specified position UD, at which raising and lowering is possible (refer to FIG. 1), on the revolving path of nozzles 35. Head 30, although not shown, is provided with a separate Z-axis motor for raising and lowering a holding section that holds auto-tool 34.

Nozzle 35 is configured such that the tip of the nozzle is selectively connected to a vacuum pump and air piping via an electromagnetic valve. Nozzle 35 uses the negative pressure at its tip to pick up (hold) a component, and uses positive pressure at its tip to release the picking up (holding) of the component.

Component camera 38 is provided between feeder pallet 42 and board conveyance device 12 in a midway position in the left-right direction with the imaging direction facing up. Component camera 38 images a component held by nozzle 35 that passes over component camera 38.

Tape feeder 40 is a type of component supply device and is attached to feeder pallet 42 on the front of component mounter 10. Multiple slots (not shown) are provided on the upper surface of feeder pallet 42 and tape feeders 40 are inserted into those slots. Tape feeder 40 rotatably holds reel 48 on which tape is wound. Multiple recesses, not shown, are formed in the tape in a lengthwise direction of the tape. A component is stored in each recess. These components are protected by a film, not shown, that covers the upper surface of the tape. The component pickup position at feeder 40 is predetermined. The component pickup position is determined as the position at which nozzle 35 picks up the component based on design values. By the tape being fed to the rear by a specified amount each time by feeder 40, components stored in the tape are consecutively arranged at the component supply position. The film is peeled off such that when a component reaches the component pickup position the component can be picked up by nozzle 35.

Transfer unit 50 is removably attached to multiple of the slots not occupied by tape feeders 40 on feeder pallet 42. Transfer unit 50 is provided with round plate 51 and squeegee 52. Round plate 51 is fixed to an upper surface of a rotation table (not shown) provided on block-type base 53 so as to rotate together with the rotation table. Round plate 51 is provided with a round bottom surface and a side wall surrounding that bottom surface. Squeegee 52 forms coating layer 55 of a specified thickness made from solder paste supplied into round plate 51 from a paste supply line, which is not shown. Squeegee 52 is fixed to base 53 in a state extending in the diameter direction of round plate 51. Thus, when round plate 51 rotates, the solder paste in round plate 51 is formed into coating layer 55 with a thickness specified according to squeegee 52.

As shown in FIG. 2, mounting controller 60 is configured as a microprocessor centered around CPU 60a and is provided with ROM 60b for memorizing processing programs, HDD 60c for memorizing various types of data, and RAM 60 used as working memory. Connected to mounting controller 60 are input device 60e such as a mouse and keyboard, and display device 60f such as a liquid crystal display. Mounting controller 60 is connected to feeder controller 47 built into feeder 40, transfer controller 57 built into transfer unit 50, and management computer 90 such that two-way communication is possible. Also, mounting controller 60 is connected to board conveyance device 12, head 30, X-axis motor 20a, Y-axis motor 24a, and component camera 38, such that control signals can be outputted. Further, mounting controller 60 is connected to component camera 38 such that image signals can be received.

As shown in FIG. 2, management computer 90 is provided with computer main body 92, input device 94, and display 96, such that an operator can enter commands from input device 94 and various images can be output on display 96. Production job data is memorized on memory of computer main body 92. The following are defined in the production job data for production to be performed using component mounter 10: which components are to be mounted to board S and in what order, how many of those boards S are to be manufactured, and so on.

Figure 3:
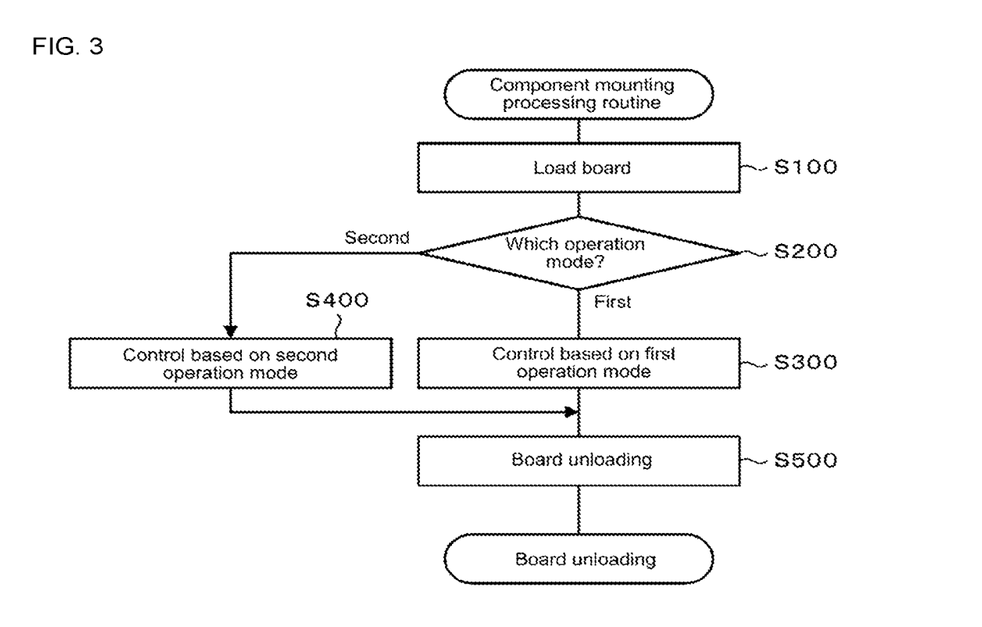
FIG. 3 is a flowchart of a component mounting routine.

Described next are operations in which CPU 60a of mounting controller 60 of component mounter 10 performs mounting of components onto board S based on a production job received from management computer 90. FIG. 3 is a flowchart of a component mounting processing routine.

First, CPU 60a controls board conveyance device 12 to load board S and position board S at a specified holding position (the position of board S in FIG. 1) inside component mounter 10 (step S100). Continuing, CPU 60a recognizes whether the operation mode is set to one of a first operation mode or a second operation mode (step S200). Here, it is assumed that one of the first operation mode or the second operation mode has been set by an operator via input device 60e. The set operation mode is memorized in RAM 60d. If the first operation mode is set as the operation mode, CPU 60a performs control based on the first operation mode (step S300), then controls board conveyance device 12 such that board S is unloaded from component mounter 10 (step S500), then ends the routine. On the other hand, if the second operation mode is set as the operation mode, CPU 60a performs control based on the second operation mode (step S400), then performs step S500, then ends the routine.

Figure 4:
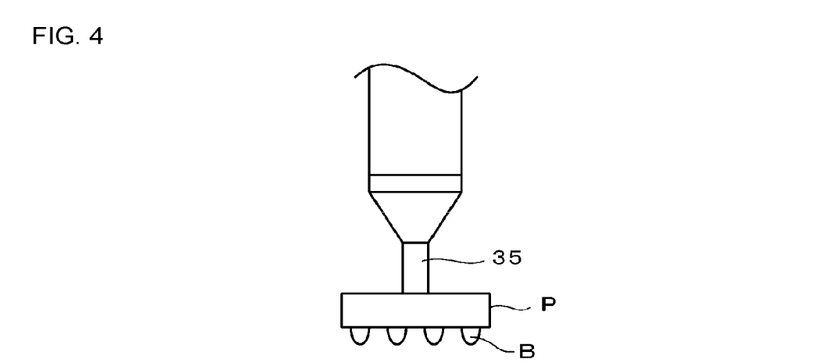
FIG. 4 illustrates component P picked up by each nozzle 35.

Described next is control based on the first operation mode of step S300, and control based on the second operation mode of step S400. Here, control based on the second operation mode is described first and then control based on the first operation mode is described. Note that, as shown in FIG. 4, components P picked up by each nozzle 35 are assumed to be all the same, the components being provided with multiple bumps B on a bottom surface of a cuboid main body.

Figure 5:
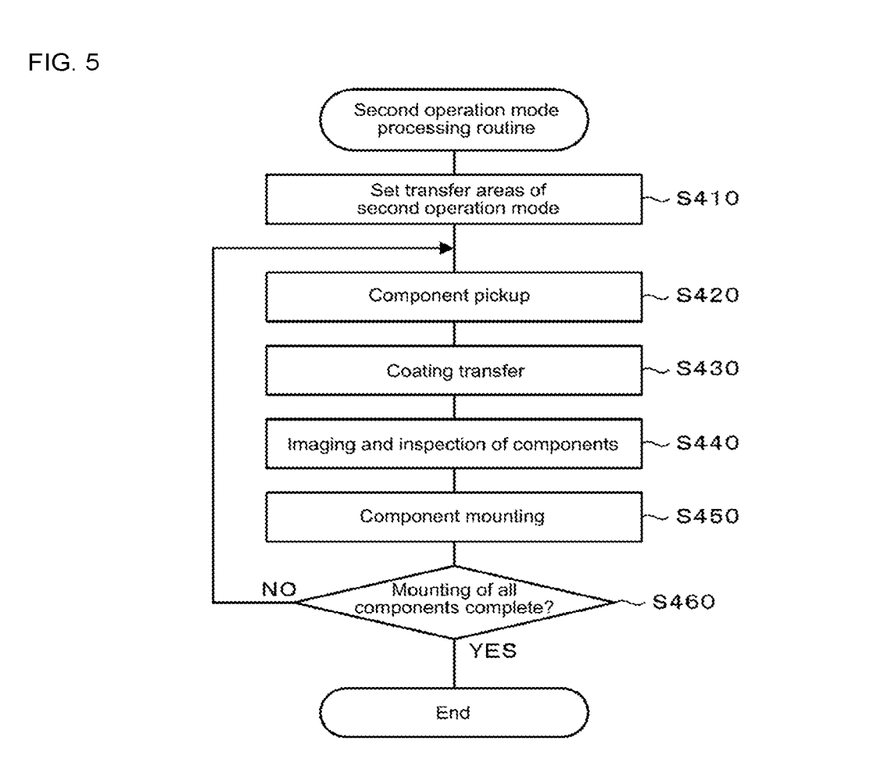
FIG. 5 is a flowchart of a second operation mode processing routine.

CPU 60a performs control based on the second operation mode according to the flowchart of FIG. 5. FIG. 5 is a flowchart of a processing routine of the second operation mode.

Figure 6:
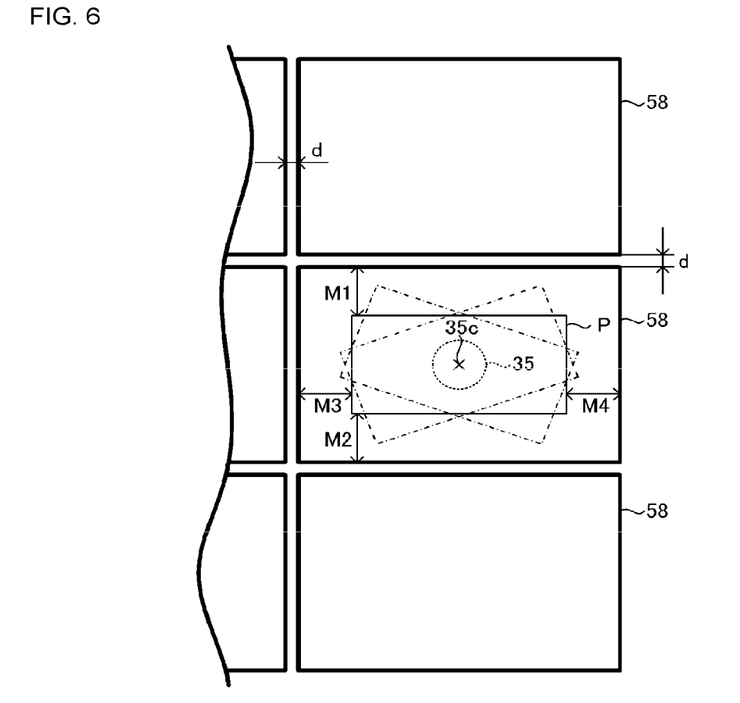
FIG. 6 illustrates transfer area 58 of the second operation mode.
Figure 7:
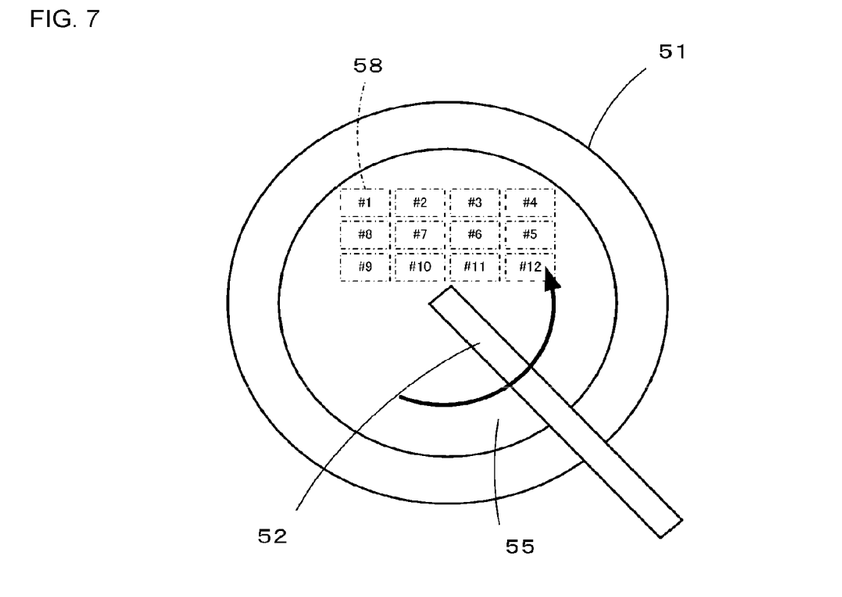
FIG. 7 illustrates coating layer 55 set in transfer area 58.

First, CPU 60a sets transfer area 58 (refer to FIGS. 6 and 7) of each component P held by nozzles 35 on coating layer 55 of the solder paste formed in round plate 51 of transfer unit 50 taking into account a margin due to the pickup deviation, that is, a margin considering the positional deviation and the rotational deviation (step S410). For component P held by nozzle 35, it is ideal if the center position of component P matches center position 35c of nozzle 35 (refer to FIG. 6), and that the component is in a specified orientation (here, a long side of component P is parallel to the X axis and a short side of component P is parallel to the Y axis). However, actually, there are many cases in which the center position of component P is deviated from center position 35c of nozzle 35, or in which the orientation of component P is rotated from the specified orientation. Such deviations may be small or large. As shown in FIG. 6, transfer area 58 of the second operation mode is set assuming a case in which the deviation of the center position and the deviation of the orientation of component P is at a maximum. The maximum value of the deviation may be determined in advance statistically by, for example, repeating pickup of component P using nozzle 35. In FIG. 6, component P held in an ideal state by nozzle 35 is shown as a rectangle with solid lines, and component P rotated from that ideal state is shown by dot-dash broken lines. The distances from the edges of the rectangle of component P picked up by nozzle 35 in an ideal state to the edges corresponding to rectangular transfer area 58 are referred to as rear margin M1, front margin M2, left margin M3, and right margin M4. In this manner, transfer area 58 is set considering the margin due to the pickup deviation. Also, transfer area separation distance d is set at a minimum distance from an adjacent transfer area 58 such that the depression in coating layer 55 caused by dipping component P does not affect the adjacent transfer area 58. In detail, transfer area separation distance d is set considering variance in the outer shape of component P, variance in the positioning of nozzle 35 in the X-axis, Y-axis, and θ-axis directions and the like, and variance in other causes of pickup deviations. As shown in FIG. 7, in the second operation mode, there are three rows and four columns of transfer areas 58 set in coating layer 55 formed in round plate 51, making a total of twelve. For convenience, the twelve transfer areas are referred to using ordinal numbers. The ordinal numbering starts with the first transfer area 58 at the rear left, then going in order to the right edge, progressing forward one row, going in order to the left edge, progressing forward one row, and going in order to the right edge. The twelve nozzles 35 of auto-tool 34 are also given ordinal numbers (first to twelfth) corresponding to the first to twelfth transfer areas 58.

Continuing, CPU 60a picks up components P using all the nozzles 35 on auto-tool 34 attached to head 30 (step S420). Specifically, CPU 60a controls X-axis motor 20a of X-axis slider 20 and Y-axis motor 24a of Y-axis slider 24 such that first nozzle 35 is moved directly above the component pickup position of the desired component supplied by tape feeder 40. Here, the nozzle holder 36 holding the first nozzle 35 is positioned at specified raising and lowering position UD at which raising and lowering of the nozzle is possible. Continuing, CPU 60a lowers nozzle holder 36 using Z-axis motor 33 and supplies negative pressure to the tip of the first nozzle 35 to pick up the component P. Then, the nozzle holder 36 of the first nozzle 35 that has picked up component P is raised to its original height. Meanwhile, CPU 60a rotates auto-tool 34 around its own center axis (R axis) using R-axis motor 31 such that the second nozzle 35 is positioned at raising and lowering position UD along the revolving path of the nozzles. Further, CPU 60a controls X-axis motor 20a of X-axis slider 20 and Y-axis motor 24a of Y-axis slider 24 such that second nozzle 35 is moved directly above the component pickup position of the desired component supplied by tape feeder 40. Then, a component P is picked up by the tip of the second nozzle 35. By repeating these operations, CPU 60a picks up a component P with all the nozzles 35 from the first to the twelfth.

Figure 8:
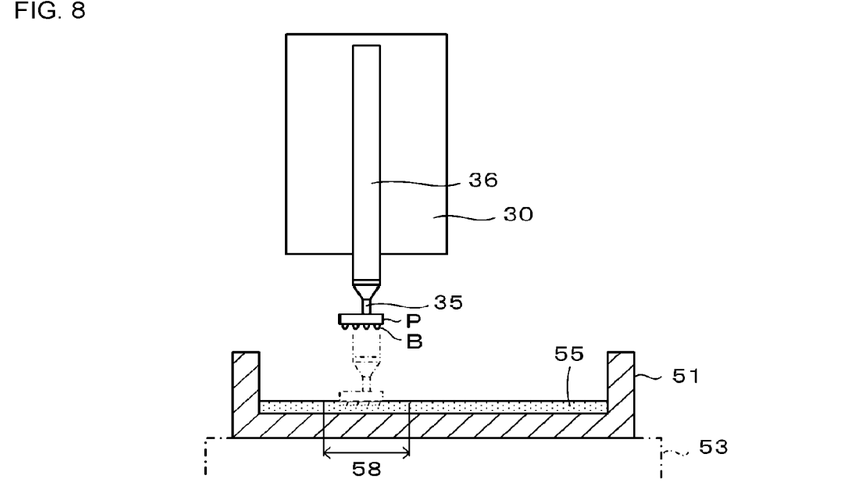
FIG. 8 illustrates a state dipping component P into transfer area 58.

Continuing, CPU 60a transfers coating layer 55 onto bumps B of components P picked up by each of the nozzles 35 (step S430). Specifically, CPU 60a controls X-axis slider 20 and Y-axis slider 24 such that center position 35c of the first nozzle 35 matches the center position of the first transfer area 58. Here, the nozzle holder 36 holding the first nozzle 35 is positioned at specified raising and lowering position UD at which raising and lowering of the nozzle is possible. CPU 60a controls Z-axis motor 33 to lower the corresponding nozzle holder 36 such that bumps of component P held by the first nozzle 35 are dipped into the first transfer area 58. FIG. 8 illustrates a state during this time. In FIG. 8, component P before dipping is shown by solid lines, and component P during dipping is shown by dot-dash broken lines. Note that, squeegee 52 is omitted from the figure. In a state with center position 35c of the nozzle 35 holding the component P matching the center position of transfer area 58, if the component P is dipped into coating layer 55, the component P will definitely be dipped while staying within transfer area 58. Transfer area 58 is set assuming a case in which the deviation of the center position and the deviation of the orientation of component P is at a maximum. Next, CPU 60a raises the nozzle holder 36 of the first nozzle 35 to its original height. Meanwhile, CPU 60a rotates auto-tool 34 around its own center axis (R axis) using R-axis motor 31 such that the second nozzle 35 is positioned at raising and lowering position UD along the revolving path of the nozzles. Further, CPU 60a controls X-axis slider 20 and Y-axis slider 24 such that center position 35c of the second nozzle 35 matches the center position of the second transfer area 58. Next, CPU 60a controls Z-axis motor 33 to lower the corresponding nozzle holder 36 such that bumps of component P held by the second nozzle 35 are dipped into the second transfer area 58. By repeating these operations, CPU 60a transfers coating layer 55 to the bumps B of components P held by nozzles 35 from the first to the twelfth. Note that, CPU 60a, after completing step S430, in preparation for the next transfer, rotates round plate 51 of transfer unit 50 and recreates coating layer 55 using squeegee 52.

Continuing, CPU 60a performs imaging and inspection of components P (step S440). Specifically, CPU 60a controls X-axis slider 20 and Y-axis slider 24 to move auto-tool 34 above component camera 38, and uses component camera 38 to image components P held by the tips of nozzles 35. CPU 60a performs imaging in one go without rotating auto-tool 54 by having all twelve components P gathered within the field of view of component camera 38. Continuing, CPU 60a performs inspection of the components P held by nozzles 35 based on the images acquired by component camera 38. CPU 60a inspects whether a component P is held by each nozzle 35, whether coating layer 55 has been transferred to bumps B of the components, and recognizes the deviation of the orientation and center position of components P. Note that, CPU 60a, for nozzles 35 for which an error was found during inspection, skips processing for that nozzle 35 in subsequent component mounting.

Next, CPU 60a mounts the components P held by nozzles 35 on board S (step S450). Specifically, CPU 60a controls X-axis slider 20 and Y-axis slider 24 such that component P held by the first nozzle 35 is moved above the first target position on board S. Here, CPU 60a considers the deviation in the orientation and center position of component P when arranging the component P above the target position. Note that, the nozzle holder 36 holding the first nozzle 35 is positioned at specified raising and lowering position UD at which raising and lowering of the nozzle is possible. CPU 60a controls Z-axis motor 33 to lower the corresponding nozzle holder 36 such that the component P held by the first nozzle 35 approaches the target position, then applies positive pressure to the tip of that nozzle 35. Thus, the component P is mounted at the first target position on board S. Next, CPU 60a raises the nozzle holder 36 of the first nozzle 35 to its original height. Meanwhile, CPU 60a rotates auto-tool 34 around its own center axis (R axis) using R-axis motor 31 such that the second nozzle 35 is positioned at raising and lowering position UD along the revolving path of the nozzles. Further, CPU 60a controls X-axis slider 20 and Y-axis slider 24 such that component P held by the second nozzle 35 is moved above the second target position on board S. Then, CPU 60a controls Z-axis motor 33 to lower the corresponding nozzle holder 36 such that the component P held by the second nozzle 35 approaches the target position, then applies positive pressure to the tip of that nozzle 35. Thus, the component P is mounted at the second target position on board S. By repeating these operations, CPU 60a mounts components P held by all the nozzles 35 from the first to the twelfth on board S.

Continuing, CPU 60a determines whether all the applicable components have been mounted on board S (step S460), returns to step S420 if not all the applicable components have been mounted on board S, and ends the routine if all the applicable components have been mounted on board S.

Figure 9:
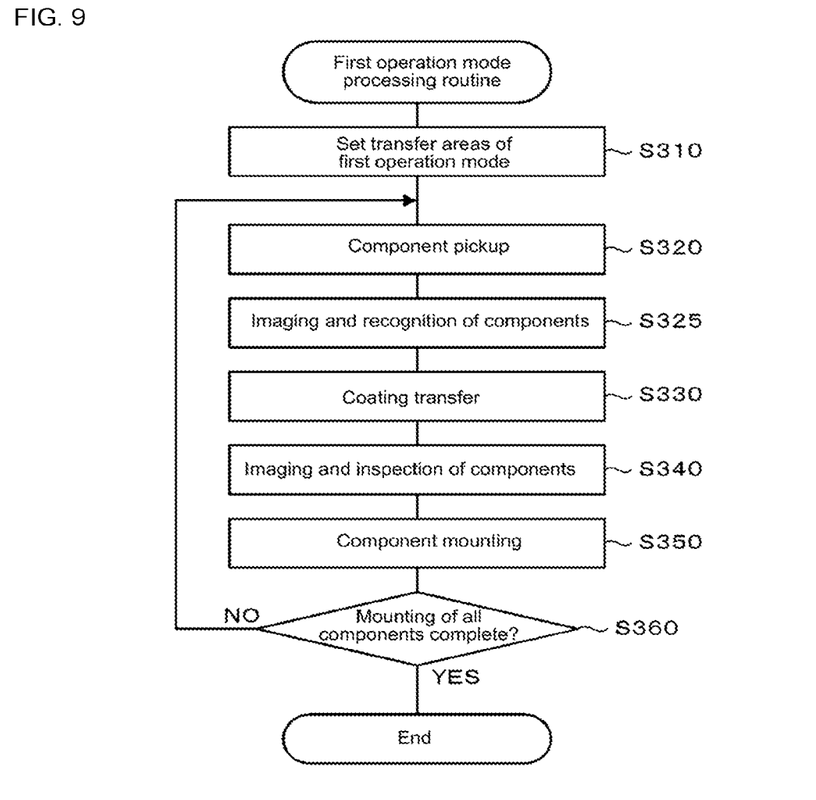
FIG. 9 is a flowchart of a first operation mode processing routine.

Control based on the first operation mode is described next. CPU 60a performs control based on the first operation mode according to the flowchart of FIG. 9. FIG. 9 is a flowchart of a processing routine of the first operation mode.

Figure 10:
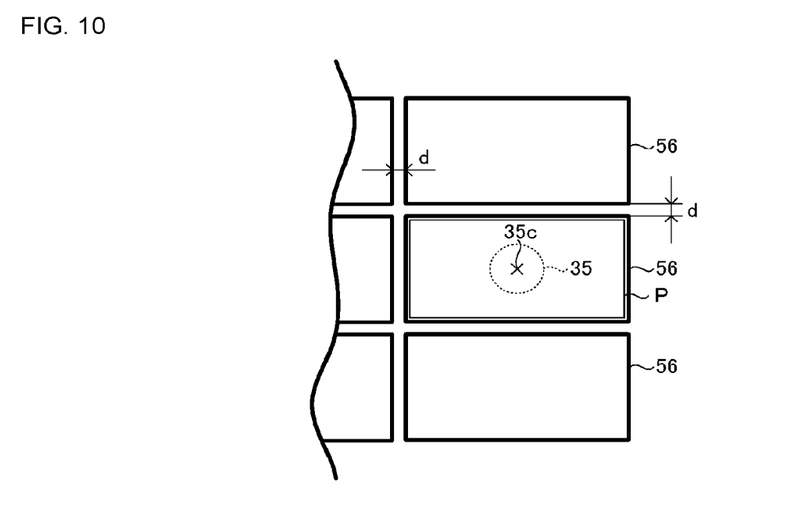
FIG. 10 illustrates transfer area 56 of the first operation mode.
Figure 11:
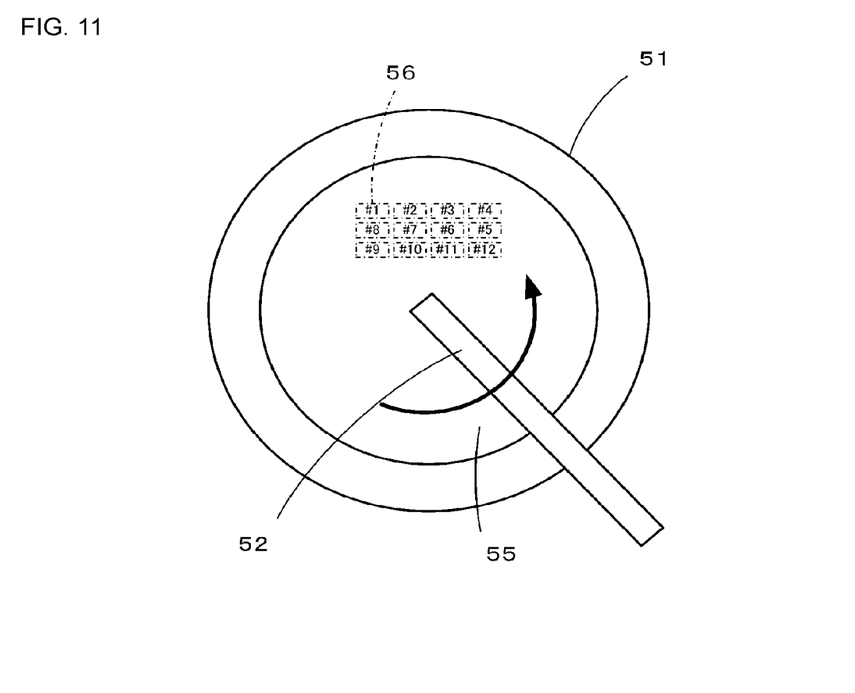
FIG. 11 illustrates coating layer 55 set in transfer area 56.

First, CPU 60a sets transfer area 56 of each component P held by nozzles 35 on coating layer 55 of the solder paste formed in round plate 51 of transfer unit 50 without taking into account a margin due to the pickup deviation (step S310). As shown in FIG. 10, transfer area 56 of the first operation mode is set corresponding to the size of the outer shape of component P, and is set to be smaller by the amount of the front-rear-left-right margins M1 to M4 compared to the transfer area 58 set considering the margin due to pickup deviation. Transfer area separation distance d is set in a similar manner to the second operation mode. As shown in FIG. 11, in the first operation mode, there are three rows and four columns of transfer areas 58 set in coating layer 55 formed in round plate 51, making a total of twelve. Similar to the second operation mode, for convenience, these transfer areas 56 are also referred to using ordinal numbers.

Continuing, CPU 60a picks up components P using all the nozzles 35 on auto-tool 34 attached to head 30 (step S320). This processing is the same as step S420 above, so descriptions are omitted.

Continuing, CPU 60a performs imaging and recognition of components P (step S325). Imaging of components P is performed similar to the first stage of processing of step S440, so descriptions are omitted. After imaging, CPU 60a recognizes the orientation and position of the center coordinates of components P held by each nozzle 35 based on the image captured by component camera 38. Specifically, CPU 60a recognizes how much the center coordinates of component P are deviated from the center coordinates of nozzle 35 in the XY directions, and recognizes to what extent the orientation of component P has rotated with respect to the ideal orientation (the orientation in which the long side of component P is parallel to the Y axis and the short side is parallel to the Y axis). Note that, CPU 60a, in a case in which a nozzle 35 not holding a component P is discovered, skips processing for that nozzle 35 in subsequent steps.

Figure 12:
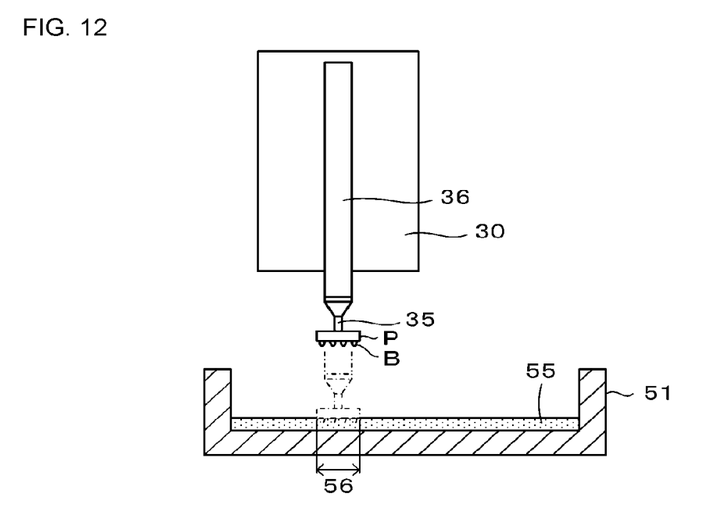
FIG. 12 illustrates a state dipping component P into transfer area 56.

Continuing, CPU 60a transfers coating layer 55 onto bumps B of components P picked up by each of the nozzles 35 (step S330). Specifically, CPU 60a controls X-axis slider 20 and Y-axis slider 24 such that the center position of component P held by the first nozzle 35 matches the center position of the first transfer area 58. Further, CPU 60a controls θ-axis motor 32 to rotate nozzle holder 36 such that the orientation of component P held by the first nozzle 35 becomes the ideal orientation. Here, the nozzle holder 36 holding the first nozzle 35 is positioned at specified raising and lowering position UD at which raising and lowering of the nozzle is possible. Continuing, CPU 60a controls Z-axis motor 33 to lower the corresponding nozzle holder 36 such that bumps of component P held by the first nozzle 35 are dipped into the first transfer area 56 (refer to FIG. 12). Because the orientation of component P is the ideal orientation, with the center position of component P matching the center position of transfer area 56, the component P can be dipped with good accuracy within the transfer area set with a size about the same as the outer shape of the component. Next, CPU 60a raises the nozzle holder 36 of the first nozzle 35 to its original height. Meanwhile, CPU 60a rotates auto-tool 34 around its own center axis (R axis) using R-axis motor 31 such that the second nozzle 35 is positioned at raising and lowering position UD along the revolving path of the nozzles. Further, CPU 60a controls X-axis slider 20 and Y-axis slider 24 such that the center position of component P held by the second nozzle 35 matches the center position of the second transfer area 58. Also, CPU 60a controls θ-axis motor 32 to rotate nozzle holder 36 such that the orientation of component P held by the second nozzle 35 becomes the ideal orientation. Next, CPU 60a controls Z-axis motor 33 to lower the corresponding nozzle holder 36 such that bumps of component P held by the second nozzle 35 are dipped into the second transfer area 58. By repeating these operations, CPU 60a transfers coating layer 55 to the bumps B of components P held by nozzles 35 from the first to the twelfth. Note that, CPU 60a, after completing step S330, in preparation for the next transfer, rotates round plate 51 of transfer unit 50 and recreates coating layer 55 using squeegee 52.

Continuing, CPU 60a performs imaging and inspection of components P (step S340). Imaging of components P is performed similar to the first stage of processing of step S440, so descriptions are omitted. For inspection of component P, CPU 60a inspects whether coating layer 55 has been suitably applied to bumps B. It is possible to distinguish between portions at which coating layer 55 is formed on bumps B and portions at which coating layer 55 is not formed on bumps B using, for example, the brightness of the image. That is, because bumps B are metal, they have a higher brightness level than coating layer 55. Therefore, it is possible to determine whether coating layer 55 has been transferred by defining a threshold value for brightness. Note that, if CPU 60a determines that coating layer 55 has not been applied appropriately on bumps B, processing for the applicable nozzle 35 is skipped in the next step. Next, CPU 60a mounts the components P held by nozzles 35 on board S (step S350). This processing is the same as step S450 above, so descriptions are omitted. Continuing, CPU 60a determines whether all the applicable components have been mounted on board S (step S360), returns to step S320 if not all the applicable components have been mounted on board S, and ends the routine if all the applicable components have been mounted on board S.

Correspondences between constituent elements of the present embodiment and constituent elements of the disclosure are described next. X-axis slider 20, X-axis motor 20a, Y-axis slider 24, and Y-axis motor 24a of the present embodiment correspond to a head moving device of the present disclosure; tape feeder 40 corresponds to a component supply device; component camera 38 corresponds to an imaging device; transfer unit 50 corresponds to a transfer device; mounting controller 60 corresponds to a control device. Also, nozzle 35 corresponds to a component holding section.

In the first operation mode of component mounter 10 described above, before transfer, based on the recognized orientation and center position of each component P, control is performed to transfer coating layer 55 to bumps B of each component P in each component P transfer area 56. Thus, even if the transfer area 56 of each component P is set as small as possible without including a margin based on the pickup deviation of each component P, it is possible to transfer the coating layer 55 accurately within that transfer area 56. Thus, the moving distance of head 30 between transfer areas is made as small as possible.

Also, in the first operation mode, because components P are mounted on board S only after determining whether coating layer 55 has been suitably transferred to bumps B of components P, for example, it is possible to cancel the mounting onto board S of a component P to which coating layer 55 has not been suitably applied.

Further, although in the first operation mode the position and orientation of each component are recognized before transfer, and, compared to the second operation mode, the processing of step S325 requires time, because the transfer area 56 of each component P can be set as small as possible, the movement time of head 30 between transfer areas is made shorter. On the other hand, in the second operation mode, the position and orientation of each component is not recognized before transfer, and, compared to the first operation mode, the transfer area 58 of each component P is set with some margin for error, therefore head 30 movement time between transfer areas is relatively longer, but step S325 is not performed so no processing time is required for this step.

Also, because an operation mode is set by an operator, control is performed based on the operation mode that the operator wants to use.

Further, because nozzle 35 that picks up and holds component P using suction is used as a component holding section of head 30, compared to a holding section that holds component P by gripping, such as a robot hand, a pickup deviation is more likely, therefore the present disclosure is particularly applicable in this case.

Meanwhile, it goes without saying that the present disclosure is not limited to the above-mentioned embodiment and various embodiments may be applied within the technical scope of the present disclosure.

For example, in an embodiment above, the operation mode is set by an operator, but CPU 60a may set the operation mode. Specifically, CPU 60a may compare component mounting time if performing control based on the first operation mode and component mounting time if performing control based on the second operation mode, and select the operation mode with a shorter component mounting time. Accordingly, control is performed using the operation mode with better throughput that is selected automatically. In this case, the component mounting time of both the operation modes may be obtained by performing a simulation, or may be obtained based on the results of actual processing. Component mounting time may be the time required to process the same production job, or the time required to mount components on a single board.

With an embodiment above, to set transfer areas 56 and 58, the outer areas of transfer areas 56 and 58 are set, but the center coordinates of transfer areas 56 and 58 may be set. The outer shape of transfer areas 56 in the first operation mode and the outer shape of transfer areas 58 in the second operation mode may be determined in advance based on the size of component P, the position deviation amount, the orientation deviation amount, or the like. Therefore, by setting the center coordinates of transfer areas 56 and 58, processing can be performed substantially in the same way as when the transfer areas 56 and 58 were set.

In an embodiment above, transfer areas 56 are set by recognizing both the orientation and center position of component P before transfer, but transfer areas 56 may be set after recognizing only one of these. For example, in a case in which the position is recognized, transfer areas 56 may be set without including a margin of the positional deviation, and when the orientation is recognized, transfer areas 56 may be set without including a margin for the orientation.

In an embodiment above, descriptions are given for a case in which the same component P is picked up and held by all of the multiple nozzles 35 on auto-tool 34, but it is not required for all the components to be the same type, different components may be mixed. In this case, transfer areas 56 and 58 may be set in accordance with the size of each component.

In an embodiment above, transfer unit 50 transfer a solder paste coating layer 55 to bumps B of components P, but the configuration is not limited to this, for example, a flux paste coating layer may be applied to bumps B of components P.

In an embodiment above, coating layer 55 is transferred to multiple bumps B on a lower surface of component P, but the configuration is not limited to this, for example, coating layer 55 may be transferred to lead terminals instead of bumps B.

In an embodiment above, tape feeder 40 is described as an example of a component supply device, but the configuration is not limited to this, for example, a tray unit provided with a magazine that stores many trays stacked in a vertical direction may be used as a component supply device.

In an embodiment above, nozzle 35 that picks up and holds a component using suction is described as an example of a component holding section, but the configuration is not limited to this, for example, a hand or arm that grips a component may be used. Also, the quantity of nozzles 35 is not restricted to twelve, so long as there are more than one.

In an embodiment above, round plate 51 is described as an example of a container of transfer unit 50, but the configuration is not limited to this, for example, a plate with a polygonal shape when seen from above (for example, a rectangle) may be used.

In an embodiment above, squeegee 52 is fixed and round plate 51 rotates, but round plate 51 may be fixed and squeegee 52 may rotate.

INDUSTRIAL APPLICABILITY

A component mounter of the present disclosure may be used to mount electronic components on a board.

REFERENCE SIGNS LIST

10: component mounter;
12: board conveyance device;
14: conveyor rail;
16: conveyor belt;
17: support pin;
20 X-axis slider;
20a: X-axis motor;
22: guide rail;
23: nut;
24: Y-axis slider;
24a: Y-axis motor;
25: Y-axis ball screw;
26: guide rail;
30: head;
31: R-axis motor;
32: θ-axis motor;
33 Z-axis motor;
34: auto-tool;
35: nozzle;
35c: center position;
36: nozzle holder;
38: component camera;
40: tape feeder;
42: feeder pallet;
47: feeder controller;
48: reel;
50: transfer unit;
51: round tray;
52: squeegee;
53: base;
54: auto-tool;
55: coating layer;
56: transfer area;
57: transfer controller;
58: transfer area;
60: mounting controller;
60a: CPU;

60b: ROM;
60c: HDD;
60d: RAM;
60e: input device;
60f: display device;
90: management computer;
92: computer main body;
94: input device;
96: display;
B: bump;
M1: rear margin;
M2: front margin;
M3: left margin;
M4: right margin;
P: component;
S: board;
UD: possible up-down position

The invention claimed is:

1. A component mounter comprising:
a head provided with multiple component holding sections;
a head moving device configured to move the head;
a component supply device configured to supply components, provided with connection terminals on a lower side of the components, to the component holding sections;
an imaging device configured to image a component of the components held by the component holding sections;
a transfer device configured to provide a coating layer of a paste that is to be transferred to the connection terminals of the component; and
a control device configured to control the head, the head moving device, the component supply device, the imaging device, and the transfer device based on a first operation mode and a second operation mode,
in the first operation mode, the control device is configured to perform control to cause the imaging device to image the components held by the multiple component holding sections, recognize at least one of a position and an orientation of each of the components based on the images of each component, and control the head and the head moving device based on at least one of the position and the orientation of each of the components to transfer the coating layer of respective first transfer areas of the transfer device to the connection terminals of each of the components, and
in the second operation mode, the control device is configured to control the head and the head moving device to transfer the coating layer of respective second transfer areas of the transfer device to the connection terminals of each of the components, the second transfer areas being larger than the first transfer areas.

2. The component mounter according to claim 1, wherein the control device is configured to, in the first operation mode, after the coating layer has been applied to each of the connection terminals of each of the components in each of the first transfer areas, and before mounting each of the components on a board, cause the imaging device to image the components held by the multiple component holding sections, and determine whether the coating layer has been appropriately transferred to the connection terminals of each of the components based on the image of each component.

3. The component mounter according to claim 1, wherein a component holding section of the multiple component holding sections is a nozzle that holds a component using suction.

4. The component mounter according to claim 1, wherein the control device is configured to compare a component mounting time if performing control based on the first operation mode and a component mounting time if performing control based on the second operation mode, and select the operation mode with a shorter component mounting time.

5. The component mounter according to claim 1, wherein the control device is configured to perform control based on an operation mode entered by an operator.

6. The component mounter according to claim 1, wherein a difference in an area of the first transfer areas and an area of the second transfer areas is based on a holding deviation of each of the components.

7. A component mounter comprising:
a head provided with multiple component holding sections;
a head moving device configured to move the head;
a component supply device configured to supply components, provided with connection terminals on a lower side of the components, to the component holding sections;
an imaging device configured to image a component of the components held by the component holding sections;
a transfer device configured to provide a coating layer of a paste that is to be transferred to the connection terminals of the component; and
a control device configured to control the head, the head moving device, the component supply device, the imaging device, and the transfer device based on a first operation mode, wherein
in the first operation mode, the control device is configured to perform control to, after the components supplied by the component supply device have been sequentially picked up by the multiple component holding sections of the head, cause the imaging device to image the components held by the multiple component holding sections, recognize at least one of a position and an orientation of each of the components based on the images of each component, and control the head and the head moving device based on at least one of the position and the orientation of each of the components such that the coating layer is transferred to the connection terminals of each of the components in a transfer area of each of the components set in advance that does not include a margin based on a holding deviation of each of the components, and then each of the components is mounted on a board,
the control device is configured to control the head, the head moving device, the component supply device, the imaging device, and the transfer device based on a second operation mode in addition to the first operation mode, and
in the second operation mode, after the components supplied by the component supply device have been sequentially picked up by the multiple component holding sections, the coating layer is transferred to the connection terminals of each of the components in the transfer area of each of the components set in advance that includes a margin based on the holding deviation of each of the components, and then each of the components is mounted on the board.

8. The component mounter according to claim 7, wherein the control device is configured to compare a component mounting time if performing control based on the first operation mode and a component mounting time if performing control based on the second operation mode, and select the operation mode with a shorter component mounting time.

9. The component mounter according to claim 7, wherein the control device is configured to perform control based on an operation mode entered by an operator.

10. The component mounter according to claim 7, wherein
the control device is configured to, in the first operation mode, after the coating layer has been applied to each of the connection terminals of each of the components in each of the set component transfer areas, and before mounting each of the components on the board, cause the imaging device to image the components held by the multiple component holding sections, and determine whether the coating layer has been appropriately transferred to the connection terminals of each of the components based on the image of each component.

* * * * *